United States Patent [19]

Maeda

[11] Patent Number: 5,442,651

[45] Date of Patent: Aug. 15, 1995

[54] EXTERNAL CAVITY CONTROL SEMICONDUCTOR LASER

[75] Inventor: Minoru Maeda, Tokyo, Japan

[73] Assignee: Ando Electric Co., Ltd., Tokyo, Japan

[21] Appl. No.: 125,161

[22] Filed: Sep. 23, 1993

[30] Foreign Application Priority Data

Sep. 25, 1992 [JP] Japan .................................. 4-280624

[51] Int. Cl.$^6$ ............................................. H01S 3/082
[52] U.S. Cl. ........................................ 372/97; 372/20; 372/99
[58] Field of Search ...................... 372/20, 97, 99, 102

[56] References Cited

U.S. PATENT DOCUMENTS

| | | | |
|---|---|---|---|
| 3,753,148 | 8/1973 | Billman | 372/102 |
| 4,302,730 | 11/1981 | Jernigan | 331/94.5 |
| 4,589,115 | 5/1986 | Burnham et al. | 372/20 |
| 4,696,012 | 9/1987 | Harshaw | 372/99 |
| 4,709,368 | 11/1987 | Fukuda et al. | 372/99 |
| 4,769,805 | 9/1988 | Gottfried | 372/72 |
| 4,873,692 | 10/1989 | Johnson et al. | 372/102 |
| 4,879,722 | 11/1989 | Dixon et al. | 372/75 |
| 4,955,026 | 9/1990 | Hill et al. | 372/32 |
| 5,018,831 | 5/1991 | Wyatt et al. | 372/102 |
| 5,081,630 | 1/1992 | Lowenthal et al. | 372/102 |
| 5,140,599 | 8/1992 | Trutna et al. | 372/102 |
| 5,163,058 | 11/1992 | Farries et al. | 372/71 |
| 5,172,382 | 12/1992 | Loh et al. | 372/106 |

FOREIGN PATENT DOCUMENTS 0176329 4/1986 European Pat. Off. .

OTHER PUBLICATIONS

Merkle et al; "$CO_2$ Waveguide Laser with Fox-Smith Mode Selector"; *IEEE J. of Quant. Elec.;* vol. QE-19, No. 11; Nov. 1983; pp. 1663–1667.

"130 GHz Frequency Sweep over a 30 nm Tuning Range without Mode Hopping by an External—Cavity Semiconductor Laser", IEICE Trans. Commun. vol. E75-B, No. 6, Jun. 1992.

"Compact hybrid resonant optical reflector lasers with very narrow linewidths", Appl. Phys. Lett. 58 (5), 4 Feb. 1991.

"Narrow—Band Resonant Optical Reflectors and Resonant Optical Transformers for Laser Stabilization and Wavelength Division Multiplexing", IEEE Journal of Quantum Electronics, vol. Qe-23, No. 9, Sep. 1987.

Phase Sensitivity and Linewidth Narrowing in a Fox-Smith Configured Semiconductor Laser, 320 Applied Physics Letters, vol. 40(1982) Feb., New York, USA, S. J. Petuchowski et al.

Efficient Frequency Noise Reduction of GaAlAs Semiconductor Lasers by Optical Feedback from an External High—Finesse Resonator, 8106 IEEE Journal of Quantum Electronics, 25 (1989) Mar., Nr. 3, New York, US H. LI and H. R. Telle.

*Primary Examiner*—Rodney B. Bovernick
*Assistant Examiner*—Robert E. Wise
*Attorney, Agent, or Firm*—Finnegan, Henderson, Farabow, Garrett & Dunner

[57] ABSTRACT

One end of semiconductor laser 1 is coated an antireflection film 1A. And, the external resonator is constructed with a diffraction grating 2 and an external reflective mirror 4. Additionally, a beam splitter 3 is provided between the diffraction grating 2 and the external reflective mirror 4. An output light from antireflection film 1A of semiconductor laser 1 is transformed to a parallel light by the convex lens 5A, and is supplied to the beam splitter 3. The parallel light 13A changes a light path thereof at beam splitter 3, and is then supplied to the external resonator. A wavelength of the parallel light 13A is determined by the diffraction grating 2, so that the light has a selected wavelength, and a phase which is matched with a phase condition of the external resonator. A portion of the resonated light is reflected by the beam splitter 3, and is fed back to the semiconductor laser 1 via convex lens 5A, as a reflected light. When the light is fed back, the semiconductor laser 1 outputs a light of narrow spectral line width. This light is outputted from another end, which is not coated with antireflection film 1A, of semiconductor laser 1, and is transformed to a parallel light by the convex lens 5B. This parallel light 13B forwards to a light isolator 6, is then collected at optical fiber 8 by the convex lens 7. The light which supplied at optical fiber 8 is output to an external apparatus.

2 Claims, 3 Drawing Sheets

EXTERNAL CAVITY CONTROL SEMICONDUCTOR LASER

BACKGROUND OF THE INVENTION

1. Field of the Invention

The present invention relates to an external cavity control semiconductor laser which is used in an all technical field using an optical signal source, especially In a technical field of optical coherent communication and optical coherent measuring.

2. Prior Art

FIG. 3 shows a construction of a conventional external cavity control semiconductor laser. In this Figure, the external cavity control semiconductor laser consists of a diffraction grating 2, an antireflection film 1A, a semiconductor laser 1, an optical isolator 6 and an optical fiber 8. Semiconductor laser 1 is a Fabry-Perot type having a coating of an antireflection film 1A at one end thereof, and is driven by an LD driver 9. In FIG. 3, semiconductor laser 1 outputs a laser beam from the antireflection film 1A. The laser beam is transformed to parallel light by a convex lens 5A, then is inputted to diffraction grating 2. Diffraction grating 2 is an external reflector, and reflects a light having a specific selected wavelength. The reflected light feeds back to semiconductor laser 1.

According to this construction, an external resonator is formed by the one end of semiconductor laser 1, which is not coated with the antireflection film 1A, and diffraction grating 2. As a result, semiconductor laser 1 resonates in a signal mode, and the laser from semiconductor laser 1 is directed to the optical fiber 8 through the convex lens 5B and the optical isolator 6. In the external resonator, if the length of the resonator is longer, it can narrow the spectral line width of the laser.

Next, when diffraction grating 2 having an angle adjusting mechanism 10A is rotated, the selected wavelength changes. Therefore, it is possible to change the wavelength within a gain range (a hundred and tens of nm) of the semiconductor laser 1. And, when diffraction grating 2 having a parallel displacement mechanism 11A is moved parallel to the light axis of the resonator, the phase condition of the resonator changes. Therefore, it is possible to change the wavelength within a frequency range (several GHz) of the longitudinal mode interval. Therefore, by controlling the angle and parallel displacement of diffraction grating 2 by adjusting mechanism 10A and parallel displacement mechanism 11A at same time respectively, it is possible to change the wavelength with continually changing phase.

For example, it is reported in PROCEEDINGS OF THE 1992 IEICE SPRING CONFERENCE, C-266, 1992, by Institute of Electronics, Information and Communication Engineers, that if the external resonator is 120 mm length, the spectral line width of about 10 kHz, and a frequency of 65 GHz are obtained at the longitudinal mode interval of 1.25 GHz (0.01 nm). It is also reported In IEICE TRANS. COMMUN., VOL. E75-B, NO. 6, JUN., 1992, pp.521-523 that if the external resonator is 30 mm length, the spectral line width becomes below 50 kHz, and the phase frequency becomes 130 GHz.

However, for the construction shown in FIG. 3, when the external resonator is made longer, the spectral line width can be made narrow, the longitudinal mode interval also becomes narrow, and as a result, single mode resonance will be difficult. And, for changing the wavelength with consecutive phase, the latitude of frequency adjusting becomes narrow, then it Is difficult to continuously change the phase. And, if the external resonator is longer, the construction of the resonator becomes a large, so that it becomes sensitive to an environment changes. Therefore, it is difficult to stabilize the wavelength of the laser source.

SUMMARY OF THE INVENTION

Accordingly, it is a primary object of the present invention to provide an external cavity control semiconductor laser which is used in an all technical fields using an optical signal source, especially in a technical field of optical coherent communication and optical coherent measuring, wherein the external cavity control semiconductor laser can make to change the wavelength with a consecutive changing phase and a narrow spectral line width, without the external resonator is long.

In an aspect of the present invention, there is provided an external cavity control semiconductor laser comprising:

(a) semiconductor laser for outputting a light, said semiconductor laser be coated an antireflection film on one end thereof;

(b) an external resonator for determining a wavelength of said light and phase condition, said external resonator comprising an external mirror and said diffraction grating; and (c) beam splitter for reflecting a light output from said one end of said semiconductor laser, and be inserted between said external mirror and said diffraction grating, and having a low reflectance, said beam splitter transmitting the reflected light to said diffraction grating, and passing the light from said diffraction grating, wherein said beam splitter being an external reflector of antireflection film side, and said external resonator transforms the resonance characteristic to the reflective characteristic thereof by said beam splitter.

According to the present invention, the external resonator is constructed with the external mirror and the diffraction grating, and the beam splitter is inserted between the external mirror and the diffraction grating. The wavelength of the light which output from the semiconductor laser is determined by the external resonator. In this case, the external resonator consists in the structure having a function which transforms the resonance characteristic to the reflective characteristic. As a result, although the resonator is short, a frequency characteristic becomes steep. Therefore, in the present invention, the longitudinal mode interval can be wide, and the wavelength can be change in wide range with continuously phase, furthermore apparatus can be small.

BRIEF DESCRIPTION OF THE DRAWINGS

Further objects and advantages of the present invention will be apparent from the following description, reference being made to the accompanying drawings wherein a preferred embodiment of the present invention is clearly shown.

In the drawings.

DESCRIPTION OF A PREFERRED EMBODIMENT

Figure 1:
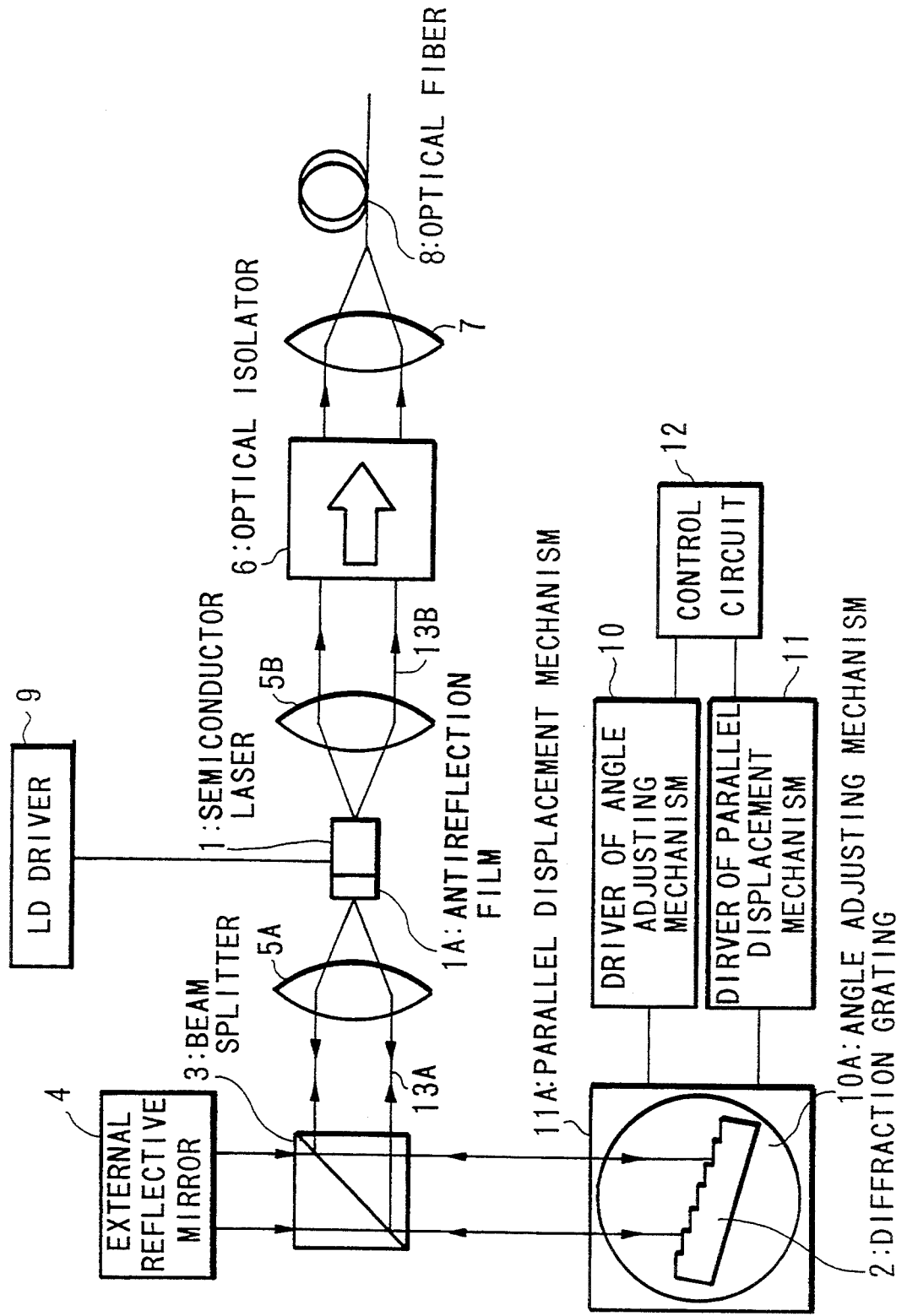
FIG. 1 is a block diagram showing the external cavity control semiconductor laser according to first embodiment of the present invention.

FIG. 1 is a block diagram showing the external cavity control semiconductor laser according to first embodiment of the present invention. In FIG. 1, semiconductor laser 1 is a Fabry-Perot type laser, wherein one end of semiconductor laser 1 is coated with an antireflection film 1A. An output light at antireflection film 1A side of semiconductor laser 1 is transformed to a parallel light. And, a resonator is constructed with an external reflective mirror 4, which has a high reflectance, and a diffraction grating 2. According to this construction, when the resonator is short, the external resonator has a steep frequency characteristic.

The parallel light 13A, which is output from one end, which is coated with the antireflection film 1A, goes through the convex lens 5A, and is directed to a beam splitter 3. The parallel light 13A changes a light path thereof at the beam splitter 3, and is then supplied to the external resonator which is constructed with the external reflective mirror 4 and the diffraction grating 2, so that the parallel light 13A resonates at the external resonator. That is, the beam splitter 3 which has a high reflectance is inserted between the external reflective mirror 4 and the diffraction grating 2, whereby the parallel light from semiconductor laser 1 forwards to the external resonator. A wavelength of the parallel light 13A is selected by the diffraction grating 2, and the light which has a selected wavelength and phase matched with a phase condition of the external resonator, then resonates at the external resonator. As a result, the parallel light will has a steep frequency characteristic.

A portion of the parallel light, i.e. a portion of the resonated light is reflected by the beam splitter 3 and the convex lens 5A again, is fed back to the semiconductor laser 1 as a reflected light. When the light which has a steep frequency characteristic is fed back to the semiconductor laser 1, semiconductor laser 1 outputs a light of a narrow spectral line width. The higher the reflectance between external reflective mirror 4 and diffraction grating 2, and the lower the reflectance of beam splitter 3, the frequency characteristic becomes steep.

A light output from another end, which is not coated with the antireflection film 1A, of semiconductor laser 1, is transformed to a parallel light by the convex lens 5B. This parallel light goes through a light isolator 6, and is then collected at one end of the optical fiber 8 by the convex lens 7. The light which supplied at optical fiber 8 is output to an external apparatus.

A functional structure which transforms the resonance characteristic to the reflective characteristic, is named ROR (Resonant Optical Reflector) structure, this ROR structure on the optical waveguide is reported and studied in IEEE J. Quantum Electron., Vol. QE-23, pp.1419-1425, 1987., and Appl. Phys. Lett., Vol.58, pp.449-451, 1991.

Figure 2:
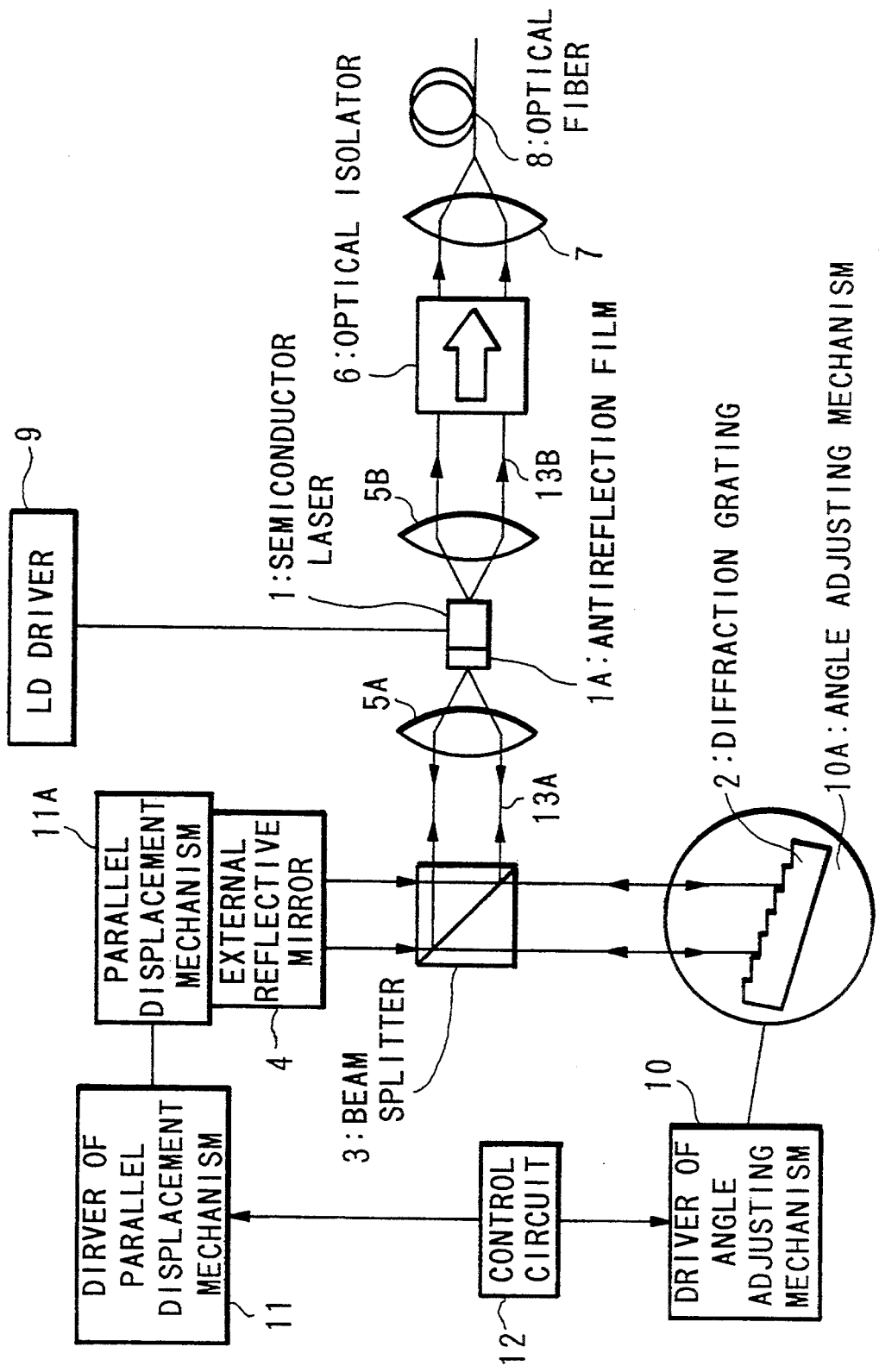
FIG. 2 is a block diagram showing the external cavity control semiconductor laser according to second embodiment of the present invention.
Figure 3:
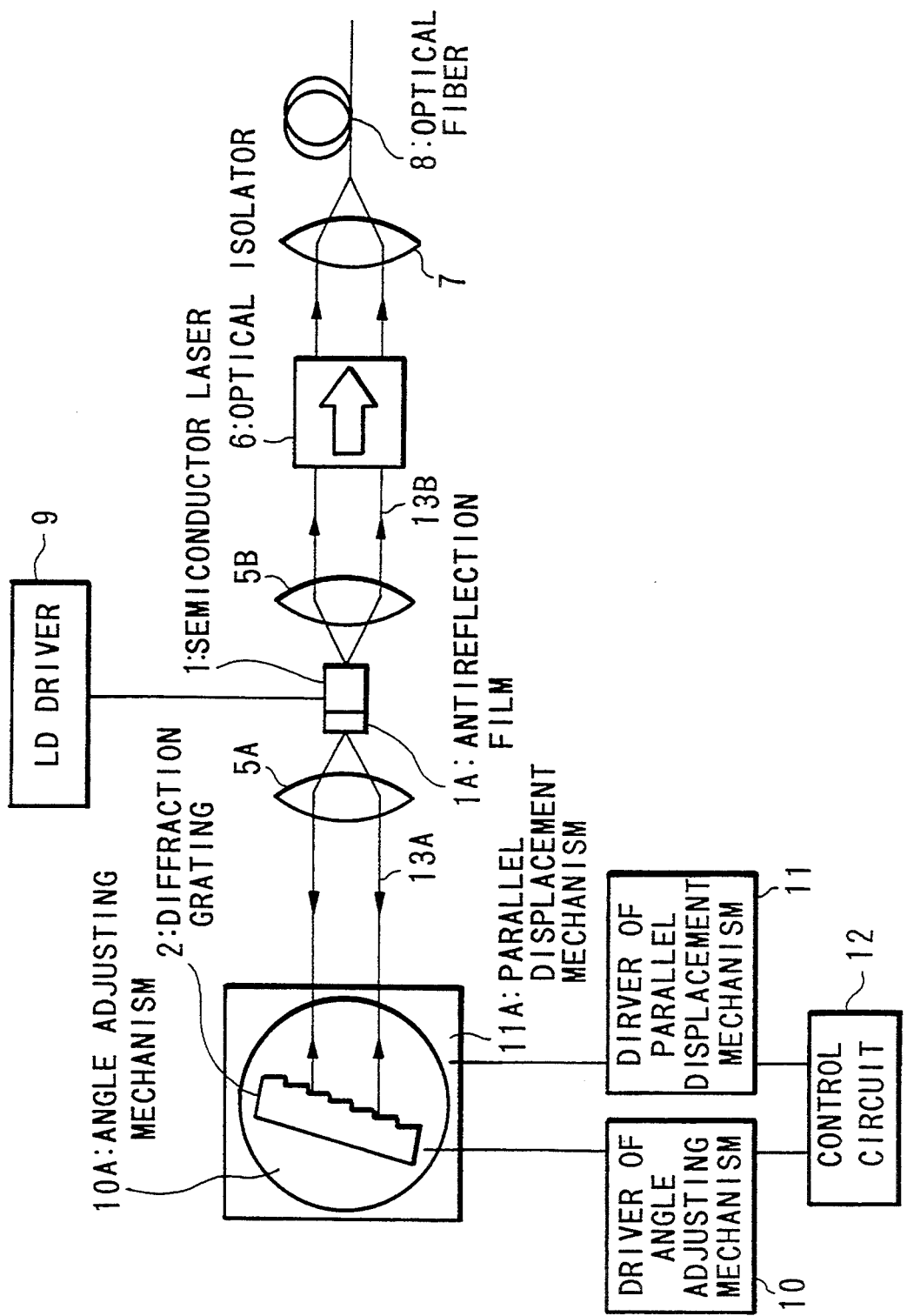
FIG. 3 is a block diagram showing the conventional external cavity control semiconductor laser.

FIG. 2 is a block diagram showing the external cavity control semiconductor laser according to second embodiment of the present invention. In FIG. 2, the angle adjusting mechanism 10A and the parallel displacement mechanism 11A, which are provided with diffraction grating 2, are separated, the angle adjusting mechanism 10A is provided with the diffraction grating 2, and the parallel displacement mechanism 11A is provided with the external reflective mirror 4. According to this construction, it is not necessary to control diffraction grating 2 with both mechanisms, so that the mechanical stability improves in this second embodiment.

As described above, according to these embodiments, the wavelength of the light which output from the external cavity control semiconductor laser is selected by the external resonator, wherein the external resonator is constructed with external mirror and diffraction grating, and the inserted beam splitter between thereof. So the external resonator consists in the structure having a function which transforms the resonance characteristic to the reflective characteristic, and has a steep frequency characteristic when the resonator is short. As a result, the longitudinal mode interval can be wide, the wavelength can be change in wide range with continuously phase, furthermore apparatus can be small.

What is claimed is:

1. An external cavity controlled semiconductor laser comprising:
    a Fabry-Perot-type semiconductor laser for outputting oscillated laser light, one end face of the semiconductor laser being coated with an antireflection film;
    an external resonator comprising an external mirror, a diffraction grating, and a beam splitter inserted between the external mirror and the diffraction grating, for controlling the wavelength of the laser light and the phase of laser oscillation;
    a parallel displacement mechanism for sliding the diffraction grating in parallel with a light axis of resonated light in the external resonator, the phase condition of the external resonator being altered by the sliding of the diffraction grating; and
    an angle adjusting mechanism for rotating the diffraction grating, the wavelength of the laser light being altered by the rotating of the diffraction grating,
    wherein the beam splitter, having low reflectance, reflects light outputted from the one end face of the semiconductor laser so as to input the reflected light into the diffraction grating and to transmit the light reflected from the diffraction grating, and the external mirror reflects the light transmitted from the beam splitter, and through the beam splitter with low reflectance the external resonator transforms a resonance characteristic to a reflective characteristic, the external resonator acting as an external reflector on the side of the antireflection film of the semiconductor laser.

2. An external cavity controlled semiconductor laser comprising:
    a Fabrey-Perot-type semiconductor laser for outputting oscillated laser light, one end face of the semiconductor laser being coated with an antireflection film;
    an external resonator comprising an external mirror, a diffraction grating, and a beam splitter inserted between the external mirror and the diffraction grating, for controlling the wavelength of the laser light and the phase of laser oscillation;
    a parallel displacement mechanism for sliding the external mirror in parallel with a light axis of resonated light in the external resonator, the phase condition of the external resonator being altered by the sliding of the external mirror; and an angle adjusting mechanism for rotating the diffraction grating, the wavelength of the laser light being altered by the rotating of the diffraction grating, wherein the beam splitter, having low reflectance, reflects light outputted from the one end face of the semiconductor laser so as to input the reflected light into the diffraction grating and to transmit the light reflected from the diffraction grating, and the external mirror reflects the light transmitted from the beam splitter and through the beam splitter with low reflectance the external resonator transforms a resonance characteristic to a reflective characteristic, the external resonator acting as an external reflector on the side of the antireflection film of the semiconductor laser.

* * * * *